US007071761B1

(12) United States Patent
Suzuki

(10) Patent No.: US 7,071,761 B1
(45) Date of Patent: Jul. 4, 2006

(54) APPARATUS AND METHOD FOR REDUCING PROPAGATION DELAY

(75) Inventor: Hidehiko Suzuki, Tokyo (JP)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/823,291

(22) Filed: Apr. 13, 2004

(51) Int. Cl.
*H03K 17/04* (2006.01)
(52) U.S. Cl. .................. 327/374; 327/112; 327/377
(58) Field of Classification Search ............. 327/17, 327/112, 170, 276, 374, 377, 437
See application file for complete search history.

(56) References Cited

U.S. PATENT DOCUMENTS

| 4,231,076 | A | * | 10/1980 | Markarian et al. | 361/512 |
| 5,130,569 | A | * | 7/1992 | Glica | 327/143 |
| 5,399,913 | A | | 3/1995 | Widener et al. | |
| 5,705,946 | A | * | 1/1998 | Yin | 327/333 |
| 6,130,569 | A | * | 10/2000 | Aswell et al. | 327/374 |
| 6,229,365 | B1 | * | 5/2001 | Iketani et al. | 327/170 |
| 6,242,973 | B1 | * | 6/2001 | Kong et al. | 327/589 |
| 6,469,562 | B1 | * | 10/2002 | Shih et al. | 327/362 |
| 6,472,906 | B1 | * | 10/2002 | Sanwo et al. | 326/83 |
| 2004/0178831 | A1 | * | 9/2004 | Li et al. | 327/112 |
| 2004/0207452 | A1 | * | 10/2004 | Vorenkamp | 327/379 |

OTHER PUBLICATIONS

Lesurf, Jim. The Scots Guide to Electronics. University of St. Andrews. [online], Dec. 29, 2002. Retrieved from the Internet:<URL: http://www.st-andrews.ac.uk/~www_pa/Scots_Guide/info/comp/passive/resistor/ohms_law/ohms_law.htm>).*

B. Arntzen et al., "Switched-Capacitor DC/DC Converter with Resonant Gate Drive", IEEE, 1996, pp. 414-420.

S.H. Wienberg, "A Novel Lossless Resonant MOSFET Driver", IEEE, 1992, pp. 1003-1010.

J.M. Bourgeois, "PCB Based Transformer for Power MOSFET Drive", IEEE, 1994, 99. 238-244.

D. Vasic et al., "A New Method to Design Piezoelectric Transformer used in MOSFET & IGBT Drive Circuits", IEEE, 2003, pp. 307-312.

* cited by examiner

*Primary Examiner*—Terry D. Cunningham
*Assistant Examiner*—Thomas J. Hiltunen
(74) *Attorney, Agent, or Firm*—Darby & Darby PC; Matthew M. Gaffney

(57) ABSTRACT

A timer circuit is arranged for reduced propagation delay and improved stability at low supply voltages. The timer circuit includes a capacitor circuit, a voltage offset circuit, an inverter circuit, and a current source circuit. The current source circuit is arranged to provide a current. Also, the capacitor circuit is arranged to provide a voltage ramp in response to the current. The voltage offset circuit is configured to provide a voltage offset. Further, the current source circuit, the capacitor circuit, and the voltage offset current are arranged to provide two voltage ramps that are offset from each other. Additionally, the inverter circuit includes a p-type transistor and an n-type transistor. The p-type transistor is configured to receive one of the two voltage ramps, and the n-type transistor is configured to receive the other of the two voltage ramps.

3 Claims, 6 Drawing Sheets

APPARATUS AND METHOD FOR REDUCING PROPAGATION DELAY

FIELD OF THE INVENTION

The invention is related to propagation delay, and in particular, to a method and apparatus for improving the propagation delay for an inverter that operates with supply voltage that is relatively close to the threshold voltage of the inverter.

BACKGROUND OF THE INVENTION

Recently, lower supply voltages have been used in many applications in order to decrease power consumption. However, when the operating supply voltage for a CMOS logic circuit is relatively close to the threshold voltage of the CMOS logic circuit, propagation delay time can become relatively large. In an application in which the input voltage changes relatively slowly, such as a timer application, the propagation delay time may be greater.

BRIEF DESCRIPTION OF THE DRAWINGS

Non-limiting and non-exhaustive embodiments of the present invention are described with reference to the following drawings, in which.

DETAILED DESCRIPTION

Figure 1:
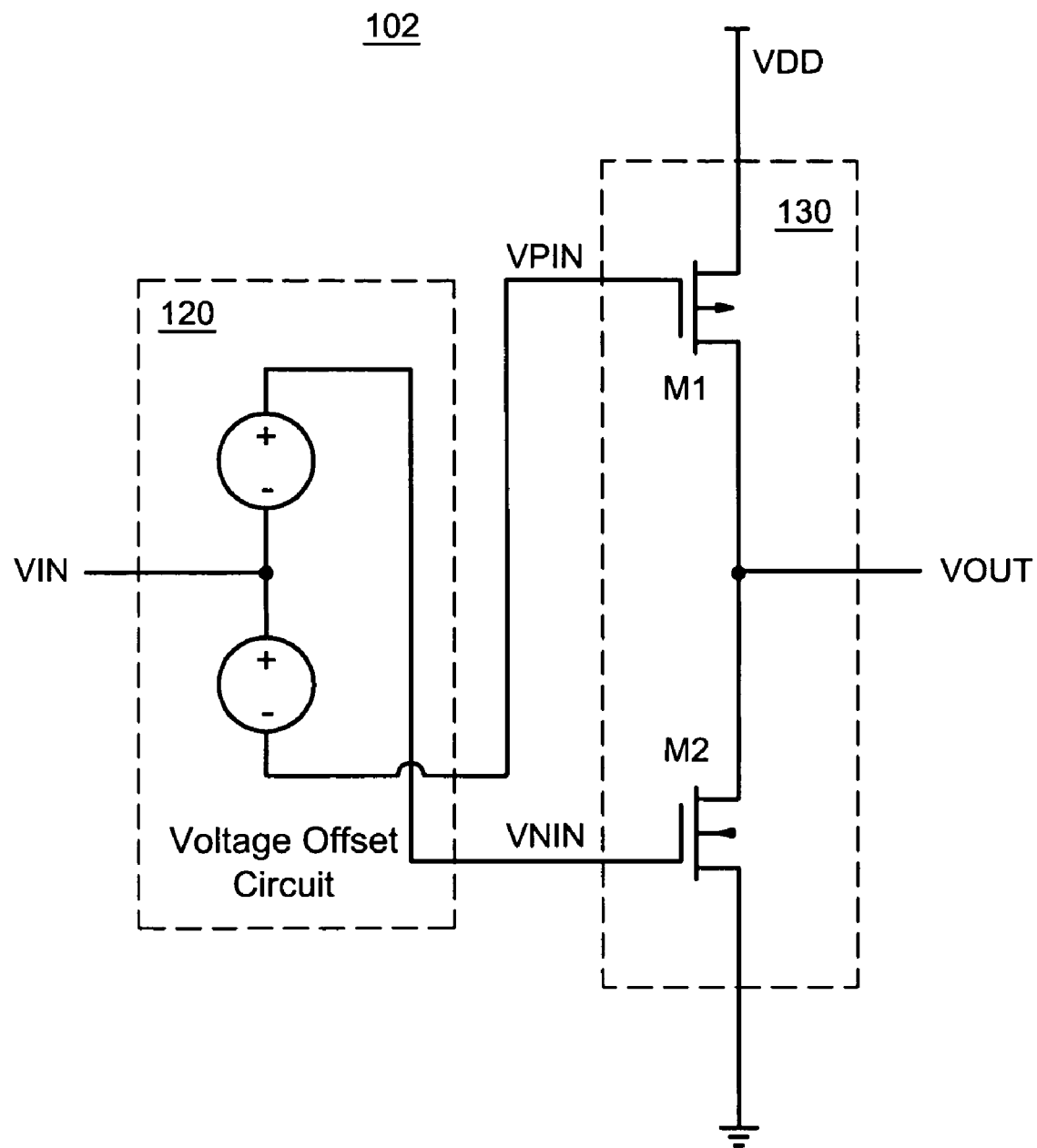
FIG. 1 shows a block diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, a timer circuit is arranged for reduced propagation delay and at low supply voltages. The timer circuit includes a capacitor circuit, a voltage offset circuit, an inverter circuit, and a current source circuit. The current source circuit is arranged to provide a current. Also, the capacitor circuit is arranged to provide a voltage ramp in response to the current. The voltage offset circuit is configured to provide a voltage offset. Further, the current source circuit, the capacitor circuit, and the voltage offset circuit are arranged to provide two voltage ramps that are offset from each other. Additionally, the inverter circuit includes a p-type transistor and an n-type transistor. The p-type transistor is configured to receive one of the two voltage ramps, and the n-type transistor is configured to receive the other of the two voltage ramps.

FIG. 1 shows a block diagram of an embodiment of circuit 102. Circuit 102 includes voltage offset circuit 120 and logic circuit 130. Logic circuit 130 includes transistors M1 and M2.

In one embodiment, logic circuit 130 is a CMOS logic circuit. In other embodiments, logic circuit 130 may includes transistors other than MOSFET transistors, such as BJTs, and the like. In any case, transistor M1 is a p-type transistor, and transistor M2 is an n-type transistor. In one embodiment, logic circuit 130 includes an inverter circuit. In other embodiments, logic circuit 130 may be another type of logic circuit, such as a NAND gate, a NOR gate, and the like.

Instead of receiving identical inputs at the gates of transistors M1 and M2 like a standard CMOS inverter, logic circuit 130 is arranged to receive signal VPIN at the gate of transistor M1, and further arranged to receive signal VNIN at the gate of transistor M2. Logic circuit 130 is arranged to provide signal VOUT in response to signals VPIN and VNIN.

Additionally, voltage offset circuit 120 is arranged to provide signals VPIN and VNIN in response to signal VIN such that signal VNIN is offset relative to signal VPIN. Signal VNIN has a positive voltage offset relative to signal VIN. In one embodiment, signal VPIN has a negative voltage offset relative to signal VIN. In other embodiments, signal VPIN may be substantially the same as signal VIN.

Figure 2:
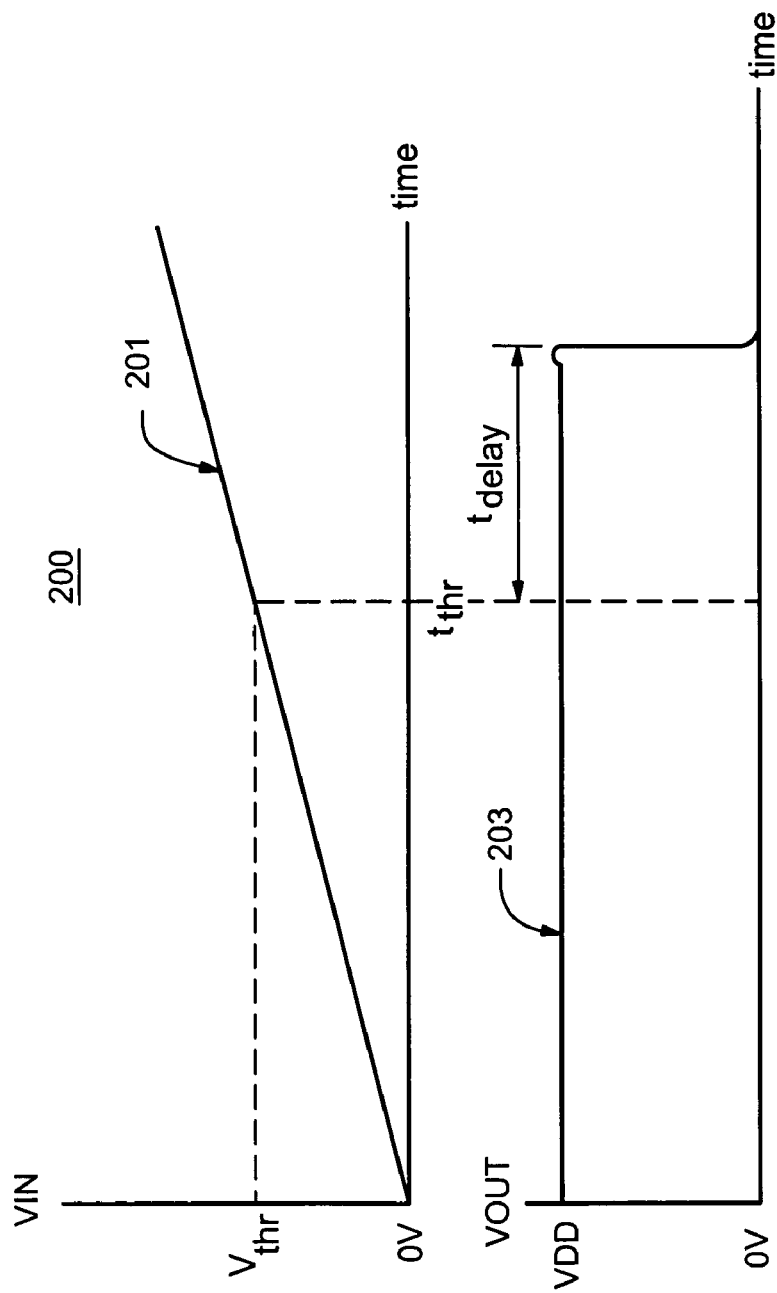
FIG. 2 illustrates a flow chart of waveforms of embodiments of the input voltage and the output voltage of FIG. 1.

FIG. 2 illustrates a timing diagram of waveforms 201 and 203 of embodiments of signals VIN and VOUT respectively, for an embodiment in which signal VIN is a linearly increasing voltage ramp. Waveform 201 shows the voltage associated signal VIN over time, and waveform 203 shows the voltage associated with signal VOUT over time.

For an embodiment in which signal VIN is a linearly increasing voltage ramp, circuit 102 operates as follows. As shown in FIG. 2, the voltage associated with signal VIN increases linearly over time. At time $t_{thr}$, the voltage associated with signal VIN reaches voltage $V_{thr}$, where $V_{thr}$ is the threshold voltage of logic circuit 130. At time $t_{thr}$, logic circuit 130 reaches threshold. When logic circuit 130 is at threshold, $V_{SG}$ of transistor M1 is substantially equal to $V_{GS}$ of transistor M2. Also, when logic circuit 130 reaches threshold, signal VOUT changes from logic one to logic zero (i.e. from VDD to 0). However, the voltage associated with signal VOUT does not change from VDD to 0 instantaneously when logic circuit 130 reaches threshold. Rather, as shown in FIG. 2, signal VOUT changes from logic one to logic zero after a propagation delay ($t_{delay}$) has occurred after the voltage associated with signal VIN reaches voltage Vthr.

When logic circuit 130 reaches threshold, if $V_{SG}+V_{TP}$ of transistor M1 is relatively small and/or $V_{GS}-V_{TN}$ of transistor M2 is relatively small, propagation delay $t_{delay}$ can be relatively large. This can particularly be a problem if supply voltage VDD is relatively small. However, by employing voltage offset circuit 120, $V_{SG}+V_{TP}$ of transistor M1 and $V_{GS}-V_{TN}$ of transistor M2 may be increased when logic circuit 130 is at threshold. Accordingly, employing voltage offset circuit 120 may allow the propagation delay of logic circuit 130 to be decreased for a relatively small supply voltage.

Figure 3:
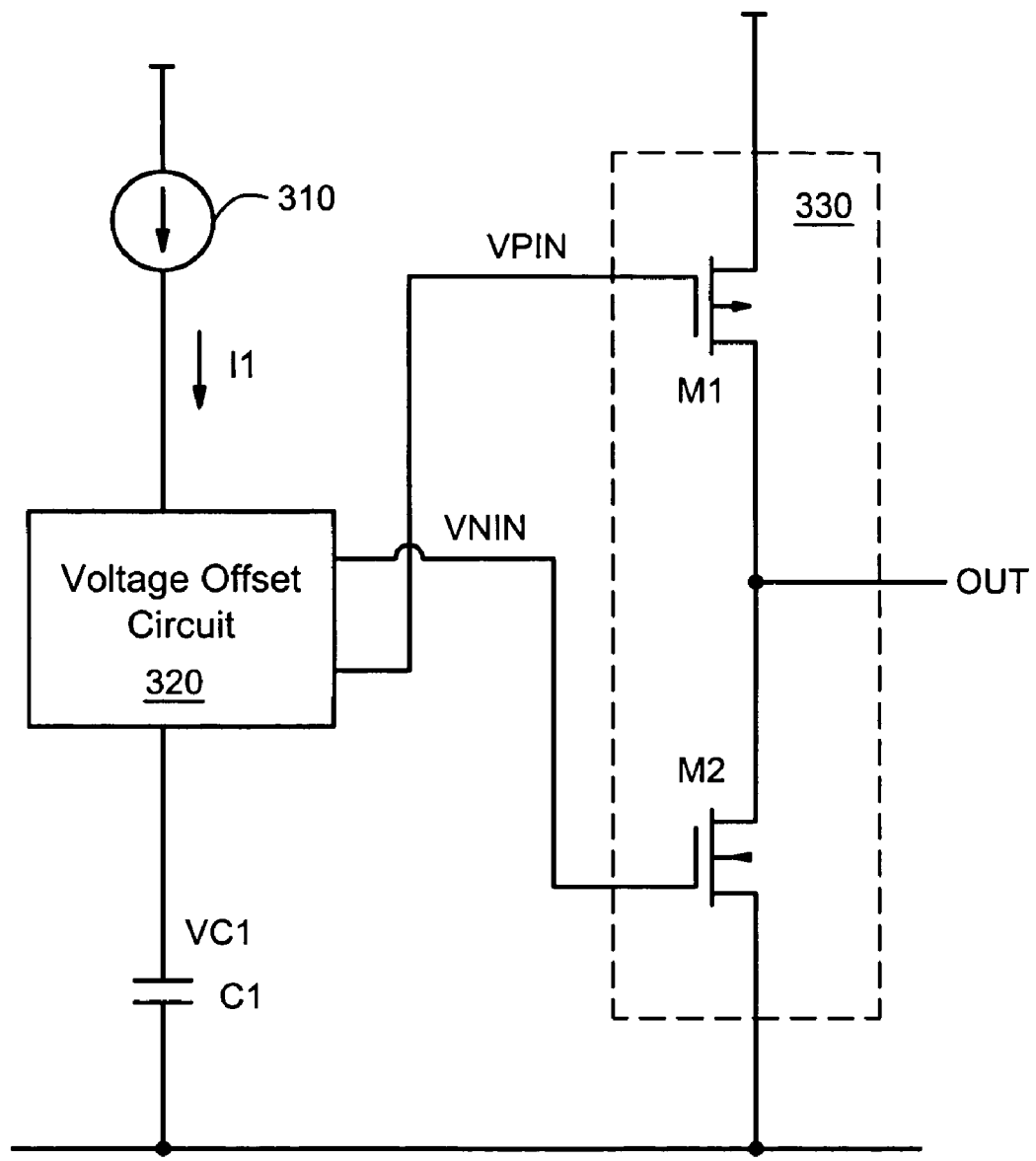
FIG. 3 shows a block diagram of an embodiment of a timer circuit.

FIG. 3 shows a block diagram of an embodiment of timer circuit 300. Timer circuit 300 includes current source circuit 310, voltage offset circuit 320, capacitor circuit C1, and inverter circuit 330. Components in timer circuit 300 may operate in a similar manner to similarly named components in circuit 102 of FIG. 1, and may operate in a different manner in some ways. Similarly, inverter circuit 330 may operate in a similar manner to logic circuit 130 of FIG. 1, and may operate in a different manner in some ways.

In operation, current source circuit 310 provides current I1. Capacitor circuit C1 may be arranged to provide voltage VC1 in response to current I1 such that voltage VC1 is a linearly increasing voltage ramp. Capacitor circuit C1 has a capacitance C. In one embodiment, capacitor circuit C1 is a single capacitor. In another embodiment, capacitor circuit C1 may include two or more capacitors coupled together in series, in parallel, and the like, to provide a total equivalent capacitance of C.

Additionally, voltage offset circuit 320 is arranged to provide signals VPIN and VNIN in response to signal VCTL such that signal VNIN is offset relative to signal VPIN. Signal VNIN has a positive voltage offset relative to signal VCTL. In one embodiment, signal VPIN has a negative voltage offset relative to signal VCTL. In other embodiments, signal VPIN may be substantially the same as signal VCTL.

Figure 4:
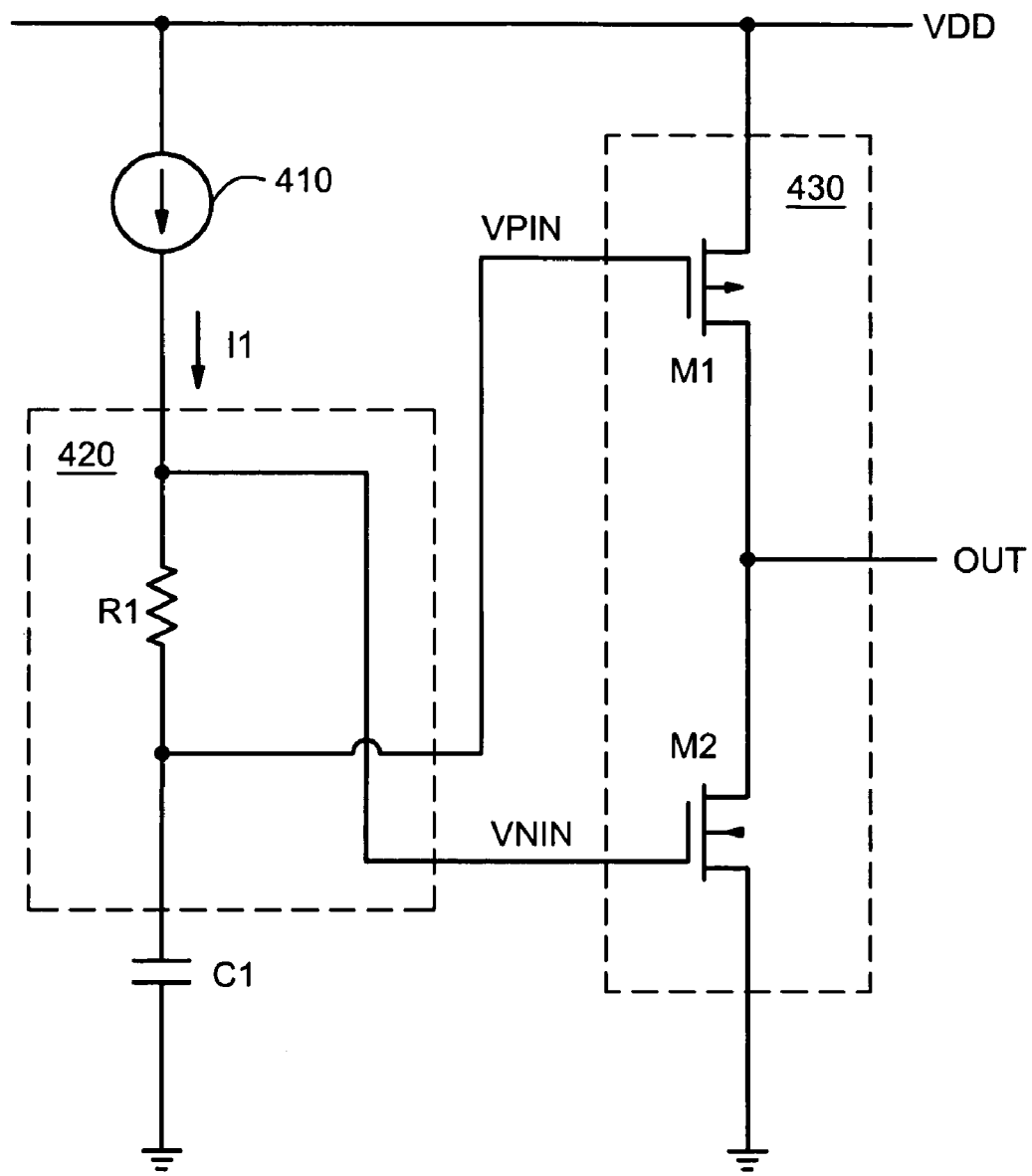
FIG. 4 schematically illustrates an embodiment of the timer circuit of FIG. 3.

FIG. 4 schematically illustrates an embodiment of timer circuit 400. Components in timer circuit 400 may operate in a similar manner to similarly named components in timer circuit 300 of FIG. 3, and may operate in a different manner in some ways. In timer circuit 400, voltage offset circuit 420 includes resistor circuit R1.

In operation, capacitor circuit C1 may be configured to provide signal VPIN in response to current I1 such that signal VPIN is a linearly increasing voltage ramp. Capacitor circuit C1 has a capacitance C.

Additionally, resistor R1 may be arranged to provide signal VNIN such that signal VNIN is substantially given by VPIN+I1*R1. In one embodiment, resistor circuit R1 is a single resistor. In other embodiments, resistor circuit R1 may include one or more resistors coupled together in series, in parallel, and the like.

When the threshold of inverter circuit 430 is reached, $V_{SG}$ of transistor M1 is substantially equal to $V_{GS}$ of transistor M2. Therefore, at the threshold of inverter circuit 130, VPIN may be substantially given by (VDD-I1*R1)/2, and VNIN may be substantially given by (VDD+I1*R1)/2. If resistor R1 were not included in timer circuit 400, then, at threshold, $V_{SG}$ of transistor M1 and $V_{GS}$ of transistor M2 would both be approximately VDD/2. By including resistor R1 in circuit 430, $V_{SG}$ of transistor M1 and $V_{GS}$ of transistor M2 are both approximately (I1*R1)/2 greater.

Additionally, VPIN(t) may be substantially given by I1*t/C1, where t is time, and where VPIN is substantially zero at time t=0. Also, VNIN(t) may be substantially given by I1*t/C+I1*R1.

Accordingly, the performance of circuit 400 may be roughly similar to that of a circuit that operates with a supply voltage of VDD+I1*R1, even though circuit 400 operates with a supply voltage of VDD. That is, circuit 400 has an "effective" supply voltage of roughly VDD+I1*R1. Employing resistor R1 in timer circuit 400 may substantially improve the stability circuit 400, as well as the propagation delay at low supply voltages.

Figure 5:
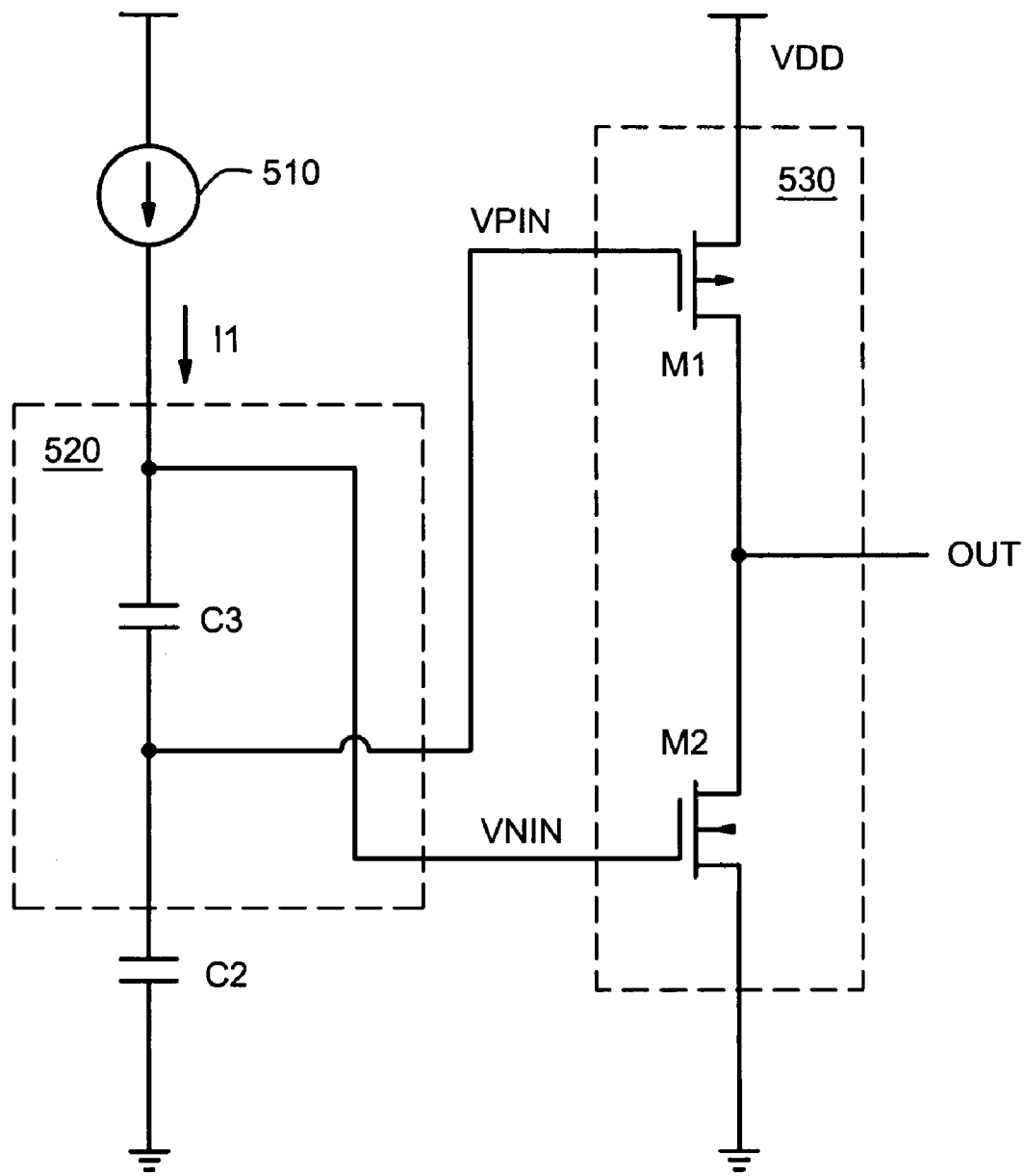
FIG. 5 shows a schematic diagram of another embodiment of the timer circuit of FIG. 3.

FIG. 5 shows a schematic diagram of an embodiment of timer circuit 500. Components in timer circuit 500 may operate in a similar manner to similarly named components in timer circuit 300 of FIG. 3, and may operate in a different manner in some ways. In timer circuit 500, voltage offset circuit 520 includes capacitor C3. Also, timer circuit 500 includes capacitor C2 in place of capacitor C1 of FIG. 3. Capacitor C2 may operate in a similar manner to capacitor C1 of FIG. 3, and may operate in a different manner in some ways. In one embodiment, capacitor C2 has a capacitance of 2C, and capacitor C3 has a capacitance of C. In this embodiment, timing circuit 500 has an equivalent timer capacitance of C. In other embodiments, capacitors C2 and C3 may have capacitances other than 2C and C. In one embodiment, one or both of capacitor circuits C2 and C3 are each single capacitors. In other embodiments, one or both of capacitor circuits C2 and C3 may include two or more capacitors coupled together in series, in parallel, and the like.

In the embodiment in which timer circuit 500 has an equivalent timer capacitance of C, when inverter circuit 500 reaches threshold, VNIN may be substantially given by ¾*VDD, and VPIN may be substantially given by ¼*VDD. Also, VPIN(t) may be substantially given by (I1*t)/2C, and VNIN(t) may be substantially given by (3*I1*t)/2C. Accordingly, circuit 500 has an "effective" supply voltage of roughly 3*VDD/2, even though circuit 500 actually operates with a supply voltage of VDD.

Figure 6:
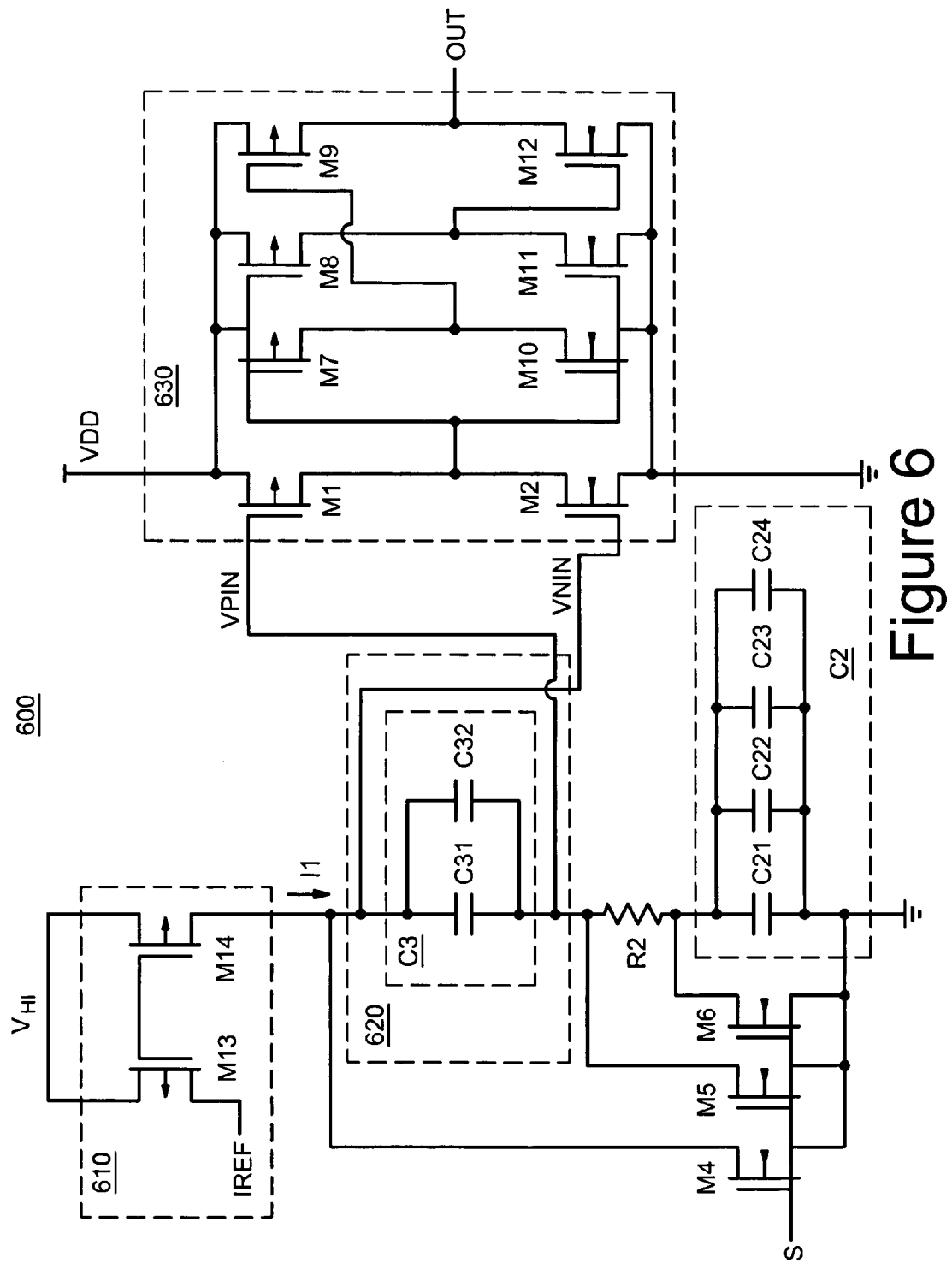
FIG. 6 schematically illustrates an embodiment of the timer circuit of FIG. 5, arranged in accordance with aspects of the present invention.

FIG. 6 schematically illustrates an embodiment of timer circuit 600. Components in timer circuit 600 may operate in a similar manner to similarly named components in timer circuit 500 of FIG. 5, and may operate in a different manner in some ways. Timer circuit 600 may further include resistor R2 and transistors M4–M6. In timer circuit 600, capacitor circuit C3 may include capacitors C31 and C32, coupled in parallel. Similarly, capacitor circuit C2 may include capacitors C21–C24, all coupled in parallel. Additionally, inverter circuit 630 may further include transistors M7–M12.

Also, current source 610 may include transistors M13 and M14, arranged as a current mirror. The current mirror may be configured to provide current I1 in response to current IREF. The sources of transistors M13 and M14 may be coupled to voltage $V_{HI}$. In one embodiment, voltage $V_{HI}$ is substantially the same as voltage VDD. In another embodiment, voltage $V_{HI}$ is a boost voltage.

Additionally, transistors M4–M6 may be arranged as transistor switches that are enabled if signal S corresponds to an asserted logic level, and disabled if signal S corresponds to a deasserted logic level. If signal S is asserted, transistors M4–M6 may cause capacitor circuits C2 and C3 to discharge, which in turn may cause voltages VPIN and VNIN to return to substantially zero. If signal S is unasserted, transistors M4–M6 may be disabled, which may cause voltages VPIN and VNIN to linearly increase.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for reducing propagation delay, comprising:
   a logic circuit including a p-type transistor and an n-type transistor, wherein a drain of the p-type transistor is coupled to a drain of the n-type transistor, and wherein the logic circuit is coupled between a low power supply and a high power supply; and
   a voltage offset circuit that is arranged to provide a first voltage to a gate of the p-type transistor, and further arranged to provide a second voltage to a gate of the n-type transistor such that the second voltage is positively offset relative to the first voltage, wherein the positive offset is less than the difference between the high power supply and the low power supply; and
   a current source that is operable to provide a first current, wherein the voltage offset circuit includes a resistor, and wherein the voltage offset circuit is operable to provide the first and second voltages such that the logic circuit performs as if the difference between the high power supply and the low power supply was approximately VDD+I1*R1, where I1 represents the first current, VDD represents a voltage of the high power supply high power supply, and where R1 represents the resistance of the resistor.

2. A timer circuit for reducing propagation delay for a relatively small supply voltage, comprising:
   a current mirror having at least an input and an output, wherein the current mirror is arranged to receive a reference current at an input of the current mirror, and to provide a current at the output of the current mirror based on the reference current;
   a capacitor circuit that is operable to provide a first voltage in response to the current;
   a voltage offset circuit that is coupled between the current source circuit and the capacitor circuit, wherein the voltage offset circuit is operable to provide a second voltage in response to the first voltage and the current such that the second voltage is positively offset relative to the first voltage; and
   an inverter circuit that includes a p-type transistor and an n-type transistor, wherein a drain of the p-type transistor is coupled to a drain of the n-type transistor, a gate of the p-type transistor is operable to receive the first voltage, and a gate of the n-type transistor is operable to receive the second voltage.

3. A timer circuit for reducing propagation delay for a relatively small supply voltage, comprising:
   a current source circuit having at least an output that is coupled to a first node, wherein the current source circuit is operable to provide a current;
   a capacitor circuit that is coupled between a second node and a third node, wherein the second node is coupled to ground, and wherein the capacitor circuit is operable to provide a first voltage at the third node;
   a voltage offset circuit that is coupled between the first node and the third node, wherein the voltage offset circuit is operable to provide a second voltage in response to the first voltage and the current such that the second voltage is positively offset relative to the first voltage; and
   an inverter circuit that includes:
      a p-type transistor having at least a gate, a drain, and a source, wherein the gate of the p-type transistor is coupled to the third node, the drain of the p-type transistor is coupled to a fourth node, and the source of the p-type transistor is coupled to a fifth node; the fifth node is a power supply node; and wherein, regardless of the logic level at the gate of the p-type transistor, the capacitor circuit is electrically coupled between the gate of the p-type transistor and the second node; and
      an n-type transistor having at least a gate, a drain, and a source, wherein the gate of the n-type transistor is coupled to the first node, the drain of the n-type transistor is coupled to the fourth node, and the source of the n-type transistor is coupled to the second node.

* * * * *

UNITED STATES PATENT AND TRADEMARK OFFICE
CERTIFICATE OF CORRECTION

| | |
|---|---|
| PATENT NO. | : 7,071,761 B1 |
| APPLICATION NO. | : 10/823291 |
| DATED | : July 4, 2006 |
| INVENTOR(S) | : Hidehiko Suzuki |

Page 1 of 1

It is certified that error appears in the above-identified patent and that said Letters Patent is hereby corrected as shown below:

Title Page Col. 2 (Other Publications), Line 3, Delete "htm>).*" and insert -- htm>.* --.

Title Page Col. 2 (Other Publications), Line 10, Delete "Piezolectric" and insert -- Piezoelectric --.

Title Page Col. 2 (Other Publications), Line 11, After "IGBT" insert -- GATE --.

Title Page Col. 2 (Attorney, Agent or Firm), Line 1, Delete "PC;" and insert -- P.C.; --.

Column 2, Line 61, Delete "Of" and insert -- of --.

Column 3, Line 3, Delete "Vthr." and insert -- $V_{thr}$. --.

Column 4, Line 8 (Approx.), Delete "11*R1," and insert -- I1*R1, --.

Column 4, Line 10 (Approx.), Delete "11*R1," and insert -- I1*R1, --.

Column 5, Line 33, In Claim 1, delete "high power supply" before ", and where".

Signed and Sealed this

Fourteenth Day of November, 2006

JON W. DUDAS
*Director of the United States Patent and Trademark Office*